United States Patent [19]

Ling

[11] Patent Number: 5,650,753
[45] Date of Patent: Jul. 22, 1997

[54] LOW-VOLTAGE RAIL-TO-RAIL OPERATIONAL AMPLIFIER

[75] Inventor: Kuok Y. Ling, Austin, Tex.

[73] Assignee: Advanced Micro Devices, Inc., Sunnyvale, Calif.

[21] Appl. No.: 489,725

[22] Filed: Jun. 13, 1995

[51] Int. Cl.$^6$ ..................................................... H03F 3/45
[52] U.S. Cl. .......................... 330/253; 330/255; 330/257
[58] Field of Search .................................. 330/253, 255, 330/257, 268

[56] References Cited

U.S. PATENT DOCUMENTS 4,554,515  11/1985  Burson et al. ..................... 330/257 X
4,766,394  8/1988  Yukawa ............................. 330/255 X

OTHER PUBLICATIONS

Horowitz et al., "The Art of Electronics", *Cambridge University Press*, New York, (1980), Chapter 3, pp. 136–143.
Holman, W. Timothy and J. Alvin Connelly, "Low Voltage Performance of a Low Noise Operational Amplifier in a 1.2 μm Digital CMOS Technology", Proceedings of the Midwest Symposium on Circuits and Systems, Lafayette, Aug. 3, 1994, pp. 111–114.

*Primary Examiner*—James B. Mullins
*Attorney, Agent, or Firm*—Kevin L. Daffer; Conley, Rose & Tayon

[57] ABSTRACT

The op-amp circuit described herein utilizes current summing to substantially eliminate cross-over distortion. Therefore, the op-amp circuit is characterized by linearity over the operable voltage range of the amplifier. Additionally, the op-amp circuit is capable of rail-to-rail input and output voltage swings. Furthermore, the op-amp circuit is capable of operating with a power supply voltage as low as two volts when fabricated in modern CMOS fabrication processes, without requiring special processing steps. An output circuit within the op-amp circuit is configured with pullup and pulldown devices which combine to provide output voltages throughout the operable range of the op-amp. However, when an output voltage equal to the power supply voltage is desired, the pulldown device substantially stops its pulldown current flow. Therefore, the pullup device charges the output conductor of the op-amp circuit fully to the power supply voltage. Similarly, when an output voltage equal to the ground voltage is desired, the pullup device substantially stops its pullup current flow. Therefore, the pulldown device discharges the output conductor fully to the ground voltage.

25 Claims, 1 Drawing Sheet

LOW-VOLTAGE RAIL-TO-RAIL OPERATIONAL AMPLIFIER

BACKGROUND OF THE INVENTION

1. Field of the Invention

This invention relates to the field of operational amplifier circuits and, more particularly, to operational amplifier circuits having minimal cross-over distortion while receiving rail-to-rail input voltage swings and providing rail-to-rail output voltage swings. In addition, the present operational amplifier circuit operates at a power supply voltage as low as two volts when fabricated in modern CMOS fabrication processes.

2. Description of the Relevant Art

Operational amplifier (op-amp) circuits have many important applications in electronic circuits, particularly those circuits which utilize feedback to produce their operation. Among the circuits which may be built with op-amps are the unity gain amplifier which conveys an output voltage substantially equal to its input voltage. Another exemplary circuit is an integrator in which the output voltage is the integral of the voltage difference between the input terminals over time. Numerous other examples of the use of op-amps are familiar to those skilled in the art.

An op-amp circuit is an amplifier circuit having an output voltage which is proportional to the voltage difference between two input terminals. The operational amplifier circuit is popular because it is an excellent voltage amplifier. For example, op-amps are characterized by extremely high input impedances and extremely low output impedances, both of which are desirable in a voltage amplifier. Since the input impedance is high, the current drawn by input terminals to the op-amp is low. Therefore, the source of the input voltage need not be capable of a large current drive. Because the output impedance is low, the voltage provided at the output of the op-amp is relatively stable for large current flows at the output.

Op-amp circuits are often configured with NMOS and PMOS transistors. As will be appreciated by those skilled in the art, NMOS and PMOS transistors are two types of transistors that are formed in a complimentary metal-oxide-semiconductor (CMOS) fabrication process. PMOS transistors and NMOS transistors have four terminals (or connection points): a gate terminal, a source terminal, a drain terminal, and a bulk terminal. Electric current flows from the source terminal to the drain terminal of a transistor when a voltage applied to the gate terminal has either a higher or lower value then the voltage applied to the source terminal, depending on the transistor type. A PMOS transistor is a transistor in which current flows if the voltage applied to the gate terminal is lower than the voltage applied to the source terminal. An NMOS transistor is a transistor in which current flows if the voltage applied to the gate terminal is higher than the voltage applied to the source terminal. The bulk terminal is connected either to the source terminal of the transistor or to a proper bias voltage.

In both the PMOS transistor and NMOS transistor, the difference in voltage between the gate terminal and the source terminal must be larger in absolute value than a certain voltage before current flow begins. This certain voltage is referred to as a "threshold" voltage and is the voltage required to form an energized channel between the source and the drain diffusion regions in the PMOS transistor or NMOS transistor. As will be appreciated by those skilled in the art, a transistor is formed on a substrate by diffusing impurities into two regions (a drain diffusion region and a source diffusion region). The two regions are separated by a distance of undiffused substrate material called a channel, over which the gate terminal is constructed. By applying a voltage to the gate terminal of the transistor, the channel is energized such that current may flow between the source diffusion region and the drain diffusion region.

Theoretical op-amp circuits are capable of "rail-to-rail" input and output operation and perfect linearity. The "rails" of an op-amp are its power supply voltages. An output is said to transition from rail-to-rail if the output conveys a voltage substantially equal to one of its power supply voltages in response to a particular input voltage, and the output conveys a voltage substantially equal to the other one of its power supply voltages in response to another input voltage. An amplifier circuit is linear if the output voltage is a constant proportion of the input voltage for any input voltage within the operable voltage range of the amplifier. That is, if the output voltage is plotted as a function of the input voltage, the result is a straight line. Unfortunately, conventional op-amp circuits (including CMOS op-amp circuits) have not been capable of rail-to-rail operation. Additionally, these op-amp circuits have not been capable of linearity. A particular problem with linearity in many op-amps is "cross-over distortion". Cross-over distortion is a disruption of the linearity of the output voltage when the input voltage is near a particular voltage (referred to as a "cross-over voltage"). For input voltages near the cross-over voltage, the output voltage remains fixed instead of assuming a value which is a constant proportion of the input voltage. As the input voltage moves farther from the cross-over voltage, the output voltage resumes its linear rise or fall. An op-amp circuit having low cross-over distortion and rail-to-rail output voltage capability is desired.

SUMMARY OF THE INVENTION

The problems outlined above are in large part solved by an op-amp circuit according to the present invention. The op-amp circuit described herein utilizes current summing to substantially eliminate cross-over distortion. Therefore, the op-amp circuit is characterized by linearity over the operable voltage range of the amplifier. Advantageously, the op-amp circuit exhibits the linearity feature of theoretical op-amp circuit operation. Such an op-amp circuit may be included in various electronic circuits. The practical operation of these electronic circuits embodying the present op-amp circuit may more closely achieve an optimal (theoretical) performance previously unobtainable by these electronic circuits utilizing conventional op-amp circuits.

The present op-amp circuit is capable of rail-to-rail input and output voltage swings. An output circuit within the op-amp circuit is configured with pullup and pulldown devices which combine to provide full rail output voltages throughout the operable range of the op-amp. However, when an output voltage equal to the power supply voltage is desired, the pulldown device substantially stops its pulldown current flow. Thereafter, the pullup device charges the output conductor of the op-amp circuit fully to the power supply voltage. Similarly, when an output voltage equal to a lower supply voltage (i.e. the ground voltage) is desired, the pullup device substantially stops its pullup current flow. Thereafter, the pulldown device discharges the output conductor fully to the ground voltage. Additionally, the present op-amp circuit is configured with an NMOS input differential pair and a PMOS input differential pair. When input signals are conveying low voltages, the PMOS input differential pair conducts current. Conversely, when input signals are conveying high voltages, the NMOS input differential pair conducts current. Therefore, as input signals swing from rail-to-rail, the op-amp circuit provides a continuous response. Prior op-amp circuits often do not provide a continuous response to rail-to-rail input voltage swings. Advantageously, the theoretical rail-to-rail operation of op-amps is achieved by an op-amp circuit according to the present invention.

The present op-amp circuit is additionally capable of low voltage operation. In one embodiment, the present op-amp circuit may be operational with a power supply voltage as low as two volts when fabricated in modern CMOS fabrication processes. Low voltage operation is advantageously achieved without adding any special processing steps to the typical CMOS fabrication process. Prior op-amp circuits often required special processing for low voltage operation, increasing manufacturing costs.

The present invention contemplates an operational amplifier circuit comprising a first input conductor, a second input conductor, an output conductor, a first reference current circuit, a second reference current circuit, a first current mirror circuit, a first transistor, a second transistor, and an output circuit. The first and second input conductors convey a first and second input voltage, respectively, while the output conductor conveys an output voltage. The first and second reference current circuits are configured to convey a first and second reference current on a first and second reference current conductor, respectively. The first transistor has a first terminal, a second terminal, and a first gate terminal which is coupled to the first input conductor. Additionally, the first terminal is coupled to the first reference current conductor. Similar to the first transistor, the second transistor has a third terminal, a fourth terminal, and a second gate terminal which is coupled to the second input conductor. Coupled between the second terminal and the third terminal is the first current mirror circuit which is configured to mirror a first current conveyed on the second terminal. The output circuit is coupled to the third terminal and to the output conductor, and is configured to convert a summed current conveyed on the third terminal to the output voltage.

The present invention further contemplates a method of eliminating cross-over distortion in an operational amplifier circuit comprising summing a first current proportional to a first input voltage and a second current proportional to a second input voltage.

BRIEF DESCRIPTION OF TEE DRAWINGS.

Other objects and advantages of the invention will become apparent upon reading the following detailed description and upon reference to the accompanying drawings in which:

FIG. 1 is a diagram of an operational amplifier circuit in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
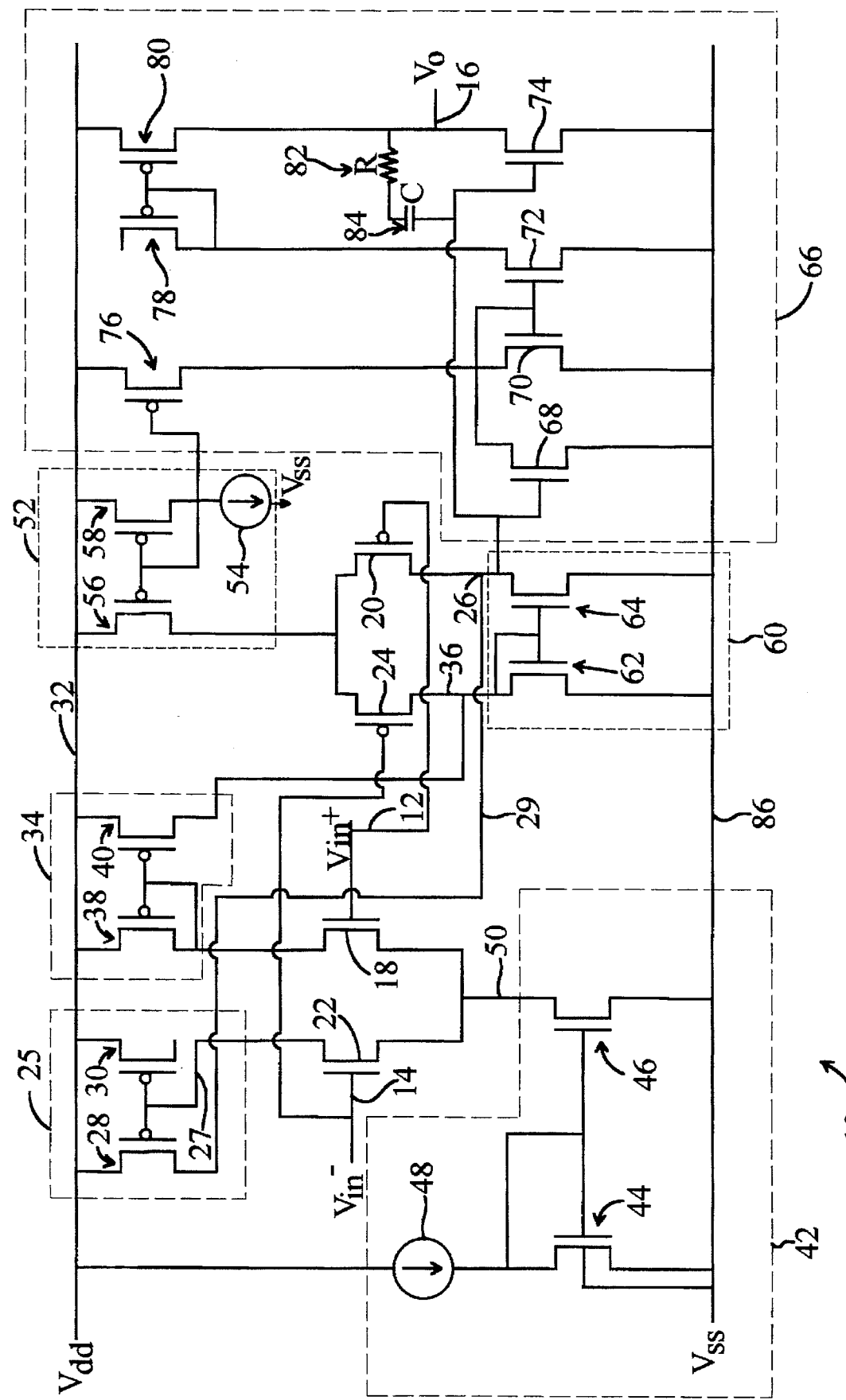

Turning now to FIG. 1, an op-amp circuit diagram in accordance with the present invention is shown. Op-amp 10 is configured with a Vin+ input conductor 12, a Vin− input conductor 14, and a Vout output conductor 16. Vin+ input conductor 12 is coupled to an NMOS transistor 18 and a PMOS transistor 20. Similarly, Vin− input conductor 14 is coupled to an NMOS transistor 22 and a PMOS transistor 24. NMOS transistors 18 and 22 are included in an NMOS input differential pair. Similarly, PMOS transistors 20 and 24 are included in a PMOS input differential pair. When input signals are conveying low voltages, the PMOS input differential pair conducts current. Conversely, when input signals are conveying high voltages, the NMOS input differential pair conducts current. Therefore, op-amp 10 is responsive to any input signal within the operable range of op-amp 10 (i.e. op-amp 10 is responsive to a rail-to-rail input signal). As will be appreciated by those skilled in the art, the NMOS and PMOS input differential pairs enable operation of op-amp 10 with a power supply voltage of as low as two volts when fabricated in modern CMOS fabrication processes. Op-amp 10 requires no special processing steps above typical CMOS fabrication processing to provide the low voltage operation.

Current flowing through NMOS transistor 22 is mirrored by a current mirror circuit 25 to node 26 within the conductive path of transistor 20. A current mirror circuit is configured to convey a current on its output conductor which is proportional to the current on its input conductor. Typically, transistors which comprise a current mirror circuit such as current mirror circuit 25 are "matched" such that they have similar conductive current characteristics for similar input voltages.

Current mirror circuit 25 is configured with a pair of PMOS transistors 28 and 30 with gate terminals coupled to the source of NMOS transistor 22. The conductor between the source terminal of NMOS transistor 22 and the gate terminals of PMOS transistors 28 and 30 (shown as reference number 27) is the input conductor of current mirror 25. When current flows through NMOS transistor 22, the gate terminals of PMOS transistors 28 and 30 are discharged. When the voltage difference between the gate terminals and a power supply voltage conveyed on a power supply conductor 32 exceeds the threshold voltages of PMOS transistors 28 and 30, the transistors begin to conduct current. As the voltage difference between the gate terminals and power supply conductor 32 continues to increase, the current flowing through PMOS transistor 30 increases until is substantially equals the current flowing through NMOS transistor 22. Since the voltage on the gate terminals of PMOS transistors 28 and 30 are equal, the current flowing through PMOS transistor 28 is proportional to the current flowing through PMOS transistor 30. Therefore, the current on conductor 29 (which is the output conductor of current mirror circuit 25) is proportional to the current on input conductor 27. A second current mirror circuit 34 similarly mirrors current flowing through NMOS transistor 18 to node 36 within the conductive path of transistor 24. Second current mirror circuit 34 comprises a pair of PMOS transistors 38 and 40 coupled similar to PMOS transistors 30 and 28, respectively.

The source terminals of NMOS transistors 22 and 18 are coupled to a reference current conductor of a reference current circuit 42. Reference current circuit 42 is configured to supply the bias current to NMOS transistors 22 and 18. A current mirror circuit formed from NMOS transistors 44 and 46 mirrors current from a current source 48 to a reference current conductor 50. Although the current mirror circuit of reference current circuit 42 is configured with NMOS transistors, the current mirror circuit functions similar to current mirror circuit 25 embodying PMOS transistors.

Instead of having the gate terminals of the transistors discharged, the NMOS current mirror of circuit 42 functions by charging the gate terminals of its transistors in response to an input current. For example, current source 48 charges the gate terminals of NMOS transistors 44 and 46 until the current flowing through NMOS transistor 44 is substantially equal to the current from current source 48.

A second reference current circuit 52 is coupled to the source terminals of PMOS transistors 20 and 24. Similar to reference current circuit 42, second reference current circuit 52 comprises a current mirror circuit and a current source 54. The current mirror circuit within second reference circuit 52 is configured with a pair of PMOS transistors 56 and 58 coupled similar to current mirror circuit 25.

Current flowing through PMOS transistor 24 and current from current mirror circuit 34 are "summed" at node 36. As used herein, current is "summed" if currents from two or more sources are combined at a node. For example, current from current mirror circuit 34 tends to charge node 36. Current flowing through PMOS transistor 24 similarly tends to charge node 36. Therefore, the two charging currents are summed at node 36. A current mirror circuit 60 comprising NMOS transistors 62 and 64 mirrors the current at node 36 to node 26, where it is summed with the currents from current mirror circuit 25 and PMOS transistor 20. Currents from current mirror circuit 25 and PMOS transistor 20 tend to charge node 26, while current from current mirror circuit 60 tends to discharge node 26. Therefore, current flowing at node 26 is the sum of currents proportional to currents flowing through NMOS transistors 18 and 22 and PMOS transistors 20 and 24.

Node 26 is additionally connected to an output circuit 66 which is configured to translate current flows at node 26 to output voltages on Vout output conductor 16. Output circuit 66 comprises NMOS transistors 68, 70, 72, and 74 and PMOS transistors 76, 78, and 80. PMOS transistor 76 is coupled into a current mirror configuration with PMOS transistor 58 such that PMOS transistor 76 mirrors the current of current source 54.

If NMOS transistor 68 is not conducting current, then the current mirror circuit formed by NMOS transistors 70 and 72 mirrors the current from PMOS transistor 76 to the current mirror circuit formed by PMOS transistors 78 and 80. PMOS transistor 80 then charges the Vout output conductor 16 to the voltage conveyed on power supply conductor 32. It is noted that NMOS transistor 74 has its gate terminal coupled to the gate terminal of NMOS transistor 68. Therefore, if NMOS transistor 68 is not conducting current then NMOS transistor 74 is not conducting current. Therefore, PMOS transistor 80 charges Vout conductor 16 substantially to the power supply rail set forth on power supply conductor 32.

However, if the gate terminal of NMOS transistor 68 is charged through the current summing described above, then current flow from PMOS transistor 76 begins to flow through NMOS transistor 68. As the voltage on the gate of NMOS transistor 68 continues to rise, the current flowing through NMOS transistor 68 substantially equals the current flowing through PMOS transistor 76. The gate terminals of NMOS transistors 70 and 72 become discharged through NMOS transistor 68, substantially stopping current flow. PMOS transistor 78 charges the gate terminals of PMOS transistors 78 and 80 to a threshold voltage below the power supply voltage conveyed on power supply conductor 32, and current flow through PMOS transistors 78 and 80 substantially stops. Meanwhile, the voltage on the gate terminal of NMOS transistor 74 is rising in conjunction with the gate voltage on NMOS transistor 68. The resulting current flow through NMOS 74 discharges Vout conductor 16. Since PMOS transistor 80 is no longer conducting current, NMOS transistor 74 discharges Vout conductor 16 fully to a ground voltage conveyed on a ground conductor 86. As can be seen from the foregoing description, op-amp 10 is advantageously capable of rail-to-rail operation of both input and output signals. Op-amp 10 is responsive to any input voltage from rail-to-rail, as the example below illustrates.

The operation of op-amp 10 may be further understood through an example. In the example, Vout conductor 16 is connected to Vin– conductor 14 via a conductor (not shown). This is the so-called "unity gain" configuration in which the output voltage of op-amp 10 is substantially equal to the input voltage (during use). In the example, Vin+ conductor 12, Vin– conductor 14, and Vout conductor 16 are at a ground voltage. Since Vin+ conductor 12 is conveying a ground voltage, substantially no current flow occurs through NMOS transistor 18. Similarly, since Vin– conductor 22 is conveying a ground voltage, substantially no current flow occurs through NMOS transistor 22. PMOS transistors 20 and 24 conduct current due to the ground voltages on their gate terminals. PMOS transistor 24 charges the gate terminals of NMOS transistors 62 and 64, causing current to flow through NMOS transistors 62 and 64. The current through NMOS transistor 64 substantially equals the current through PMOS transistor 20. If the voltage on Vout conductor 16 (and therefore the voltage on Vin– conductor 14) were to rise above ground, then current flow through PMOS transistor 24 and hence through NMOS transistor 64 would reduce. Node 26 would then be charged above ground, thereby causing NMOS transistors 68 and 74 to conduct current. NMOS transistors 68 and 74 would then discharge Vout conductor 16, returning the voltage thereon to ground. Therefore, the feedback of the output voltage on Vout conductor 16 to Vin– conductor 14 causes the output voltage to remain at ground when the voltage on Vin+ conductor 12 is at ground.

In the next step of the example, Vin+ conductor 12 is charged to a new voltage by an external source (not shown). As the voltage on Vin+ conductor 12 rises, the current flow through PMOS transistor 20 reduces and substantially stops. Therefore, the charging of node 26 ceases since Vin– conductor is still conveying the ground voltage and so no current flows through current mirror 25 to node 26. Additionally, current flow through NMOS transistor 18 begins as its gate terminal is charged, and current mirror circuit 34 mirrors the current to node 36. Current mirror circuit 60 mirrors this increased charging current as a discharging current to node 26. The voltage at node 26 decreases, reducing current flow through NMOS transistor 68.

As current flow through NMOS transistor 68 decreases, the gate terminals of NMOS transistors 70 and 72 are charged by current flowing through PMOS transistor 76. NMOS transistors 70 and 72 increase current flow, and NMOS transistor 72 discharges the gate terminals of PMOS transistors 78 and 80. PMOS transistor 80 conducts current and charges Vout conductor 16. As the voltage on Vout conductor 16 (which is coupled to Vin– conductor 14) rises, NMOS transistor 22 begins conducting current which is mirrored through current mirror 25 to node 26 as a charging current. Therefore, once the voltage on Vout conductor 16 (and Vin– conductor 14) rises to the voltage on Vin+ conductor 12, the current through NMOS transistor 22 is substantially equal to the current through NMOS transistor 18. Similarly, the current through PMOS transistor 24 is substantially equal to the current through PMOS transistor 20. The charging and discharging currents at node 26 will therefore become substantially equal and the voltage on Vout conductor 16 remains relatively steady at the voltage conveyed on Vin+ conductor 12.

For any value of voltage on Vin+ conductor 12, either NMOS transistor 18 or PMOS transistor 20 (or both) is in a state of current conduction. Furthermore, when the voltage on Vin+ conductor 12 transitions to within a threshold voltage of the power supply voltage (such that PMOS transistor 20 substantially stops conducting current), NMOS transistor 18 is strongly conducting current. Conversely, when NMOS transistor 18 substantially stops conducting current as the voltage on Vin+ conductor 12 transitions to within a threshold voltage of ground, PMOS transistor 20 is strongly conducting current. Similar relationships exist between voltages conveyed on Vin− conductor 14, NMOS transistor 22 and PMOS transistor 24. For any two values of voltages on Vin+ conductor 12 and Vin− conductor 14, currents are summed at node 26 to produce a particular output voltage on Vout conductor 16. The summing of current from PMOS transistors and NMOS transistors (with the dissimilar voltages at which they substantially stop conducting current) guarantees that any incremental change in input voltages will correspond to a respective incremental change in NMOS or PMOS currents (or both) at node 26. Since the summed current at node 26 is converted to an output voltage on output conductor 16, the output voltage will experience an incremental change for any incremental change in the summed currents (and therefore any incremental change in the input voltages). Therefore, op-amp 10 exhibits linearity and substantially no cross-over distortion for input voltages within its operable range. Between the NMOS input differential pair and the PMOS input differential pair, op-amp 10 is responsive to any input voltage.

Resistor 82 and capacitor 84 are provided to compensate op-amp 10. As will be appreciated by those skilled in the art, if op-amp 10 is coupled into a feedback network such that Vout output conductor 16 is coupled to Vin− input conductor 14, then op-amp 10 is unstable for signals above a certain frequency. That is, a signal of a certain frequency connected between Vin+ conductor 12 and Vin− conductor 14 causes positive feedback to occur for the network and the op-amp drives the output value to one of the rails or the op-amp output oscillates instead of operating according to the feedback network. Resistor 82 and capacitor 84 are a well-known compensation network for stabilizing op-amps such as op-amp 10 by adjusting the phase margin and gain margin of the circuit. A discussion of such compensation networks may be found within the publication: "The Art of Electronics" by Horowitz, et al., Cambridge University Press, New York, 1980. This publication is incorporated herein by reference in its entirety.

In accordance with the above disclosure, an op-amp having a linear output and rail-to-rail operation has been described. Through the use of current summing, cross-over distortion is eliminated. Additionally, the transistors which charge the output conductor are configured to stop current flow when an input voltage requires that the output voltage transition to the opposite rail. The op-amp disclosed herein may be advantageously coupled into a variety of feedback circuits to produce practical behavior very close to the theoretical behavior of op-amps.

Numerous variations and modifications will become apparent to those skilled in the art once the above disclosure is fully appreciated. It is intended that the following claims be interpreted to embrace all such variations and modifications.

What is claimed is:

1. An operational amplifier circuit comprising:

a first input conductor configured to convey a first input voltage;

a second input conductor configured to convey a second input voltage;

an output conductor configured to convey an output voltage;

a first reference current circuit configured to convey a first reference current on a first reference current conductor;

a first transistor having a first terminal, a second terminal, and a first gate terminal wherein said first gate terminal is coupled to said first input conductor and said first terminal is coupled to said first reference current conductor;

a second transistor having a third terminal, a fourth terminal, and a second gate terminal wherein said second gate terminal is coupled to said second input conductor;

a first current mirror circuit coupled between said second terminal and said third terminal wherein said first current mirror circuit is configured to mirror a first current conveyed on said second terminal to said third terminal;

a second reference current circuit configured to convey a second reference current on a second reference current conductor and wherein said second reference current conductor is coupled to said fourth terminal; and an output circuit coupled between said third terminal and said output conductor wherein said output circuit is configured to convert a summed current upon said third terminal to said output voltage, said output circuit comprising:

a ninth transistor having a seventeenth terminal, an eighteenth terminal, and a ninth gate terminal wherein said seventeenth terminal is coupled to a ground conductor and said ninth gate terminal is coupled to said third terminal;

a tenth transistor having a nineteenth terminal, a twentieth terminal, and a tenth gate terminal wherein said nineteenth terminal is coupled to said ground conductor, said tenth gate terminal is coupled to said eighteenth terminal, and said twentieth terminal is coupled to said eighteenth terminal;

an eleventh transistor having a twenty-first terminal, a twenty-second terminal, and an eleventh gate terminal wherein said twenty-first terminal is coupled to said ground terminal and said eleventh gate terminal is coupled to said tenth gate terminal;

a twelfth transistor having a twenty-third terminal, a twenty-fourth terminal, and a twelfth gate terminal wherein said twelfth gate terminal is coupled to said second reference current circuit, said twenty-third terminal is coupled to a power supply conductor, and said twenty-fourth terminal is coupled to said eighteenth terminal;

a thirteenth transistor having a twenty-fifth terminal, a twenty-sixth terminal, and a thirteenth gate terminal wherein said thirteenth gate terminal is coupled to said twenty-sixth terminal and to said twenty-second terminal and wherein said twenty-fifth terminal is coupled to said power supply conductor;

a fourteenth transistor having a twenty-seventh terminal, a twenty-eighth terminal, and a fourteenth gate terminal wherein said fourteenth gate terminal is coupled to said thirteenth gate terminal, said twenty-seventh terminal is coupled to said power supply conductor, and said twenty-eighth terminal is coupled to said output conductor; and a fifteenth transistor having a twenty-ninth terminal, a thirtieth terminal, and an fifteenth gate terminal wherein said fifteenth gate terminal is coupled to said third terminal, said twenty-ninth terminal is coupled to said ground conductor, and said thirtieth terminal is coupled to said output conductor.

2. The operational amplifier circuit as recited in claim 1 wherein said first transistor is an NMOS transistor.

3. The operational amplifier circuit as recited in claim 1 wherein said second transistor is a PMOS transistor.

4. The operational amplifier circuit as recited in claim 1 wherein said first reference current circuit comprises:

a third transistor having a fifth terminal, a sixth terminal, and a third gate terminal wherein said fifth terminal is coupled to said first reference current conductor, and wherein said sixth terminal is coupled to a ground conductor;

a fourth transistor having a seventh terminal, an eighth terminal, and a fourth gate terminal wherein said seventh terminal is coupled to said ground conductor, and wherein said eighth terminal is coupled to said fourth gate terminal and to said third gate terminal; and a current source coupled to said eighth terminal.

5. The operational amplifier circuit as recited in claim 4 wherein said third transistor is an NMOS transistor.

6. The operational amplifier circuit as recited in claim 4 wherein said fourth transistor is an NMOS transistor.

7. The operational amplifier circuit as recited in claim 1 wherein said second reference current circuit comprises:

a fifth transistor having a ninth terminal, a tenth terminal, and a fifth gate terminal wherein said ninth terminal is coupled to said second reference current conductor, and wherein said tenth terminal is coupled to a power supply conductor;

a sixth transistor having an eleventh terminal, a twelfth terminal, and a sixth gate terminal wherein said eleventh terminal is coupled to said power supply conductor, and wherein said twelfth terminal is coupled to said sixth gate terminal and to said fifth gate terminal; and a current source coupled to said twelfth terminal.

8. The operational amplifier circuit as recited in claim 7 wherein said fifth transistor is a PMOS transistor.

9. The operational amplifier circuit as recited in claim 7 wherein said sixth transistor is a PMOS transistor.

10. The operational amplifier circuit as recited in claim 1 wherein said first current mirror comprises:

a seventh transistor having a thirteenth terminal, a fourteenth terminal, and a seventh gate terminal wherein said thirteenth terminal is coupled to a power supply conductor and wherein said fourteenth terminal is coupled to said second terminal and wherein said seventh gate terminal is coupled to said second terminal; and an eighth transistor having a fifteenth terminal, a sixteenth terminal, and an eighth gate terminal wherein said fifteenth terminal is coupled to said power supply conductor and wherein said sixteenth terminal is coupled to said third terminal and wherein said eighth gate terminal is coupled to said seventh gate terminal.

11. The operational amplifier circuit as recited in claim 10 wherein said seventh transistor is a PMOS transistor.

12. The operational amplifier circuit as recited in claim 10 wherein said eighth transistor is a PMOS transistor.

13. The operational amplifier circuit as recited in claim 1 further comprising a resistor and a capacitor wherein said resistor and said capacitor are coupled in series, and wherein said resistor is coupled to said output conductor, and wherein said capacitor is coupled to said third terminal.

14. The operational amplifier circuit as recited in claim 1 further comprising:

a sixteenth transistor having a thirty-first terminal, a thirty-second terminal, and a sixteenth gate terminal wherein said thirty-first terminal is coupled to said first terminal and said sixteenth gate terminal is coupled to said second input conductor;

a seventeenth transistor having a thirty-third terminal, a thirty-fourth terminal, and a seventeenth gate terminal wherein said seventeenth gate terminal is coupled to said first input conductor and said thirty-third terminal is coupled to said fourth terminal;

a second current mirror circuit coupled between said thirty-second terminal and said thirty-fourth terminal wherein said second current mirror circuit is configured to mirror a second current conveyed on said thirty-second terminal; and a third current mirror circuit coupled between said thirty-fourth terminal and said third terminal wherein said third current mirror circuit is configured to mirror a third current conveyed on said thirty-fourth terminal.

15. The operational amplifier circuit as recited in claim 14 wherein said sixteenth transistor is an NMOS transistor.

16. The operational amplifier circuit as recited in claim 14 wherein said seventeenth transistor is a PMOS transistor.

17. An operational amplifier circuit, comprising:

a first input transistor and a second input transistor having respective first and second conductive paths and gate terminals, said gate terminals are connected to respective first and second input conductors;

a first summing node coupled to receive mirrored current from said first conductive path as well as current produced through a third conductive path formed by a signal upon the gate terminal of said second input transistor; and an output circuit coupled between said first summing node and an output conductor, wherein said output circuit is configured to convert current within said first summing node to an output voltage forwarded to said output conductor, said output circuit comprising a pullup transistor connected to convey a high output voltage upon said output conductor and a pulldown transistor connected to convey a low output voltage upon said output conductor, whereupon said pullup transistor is deactivated and said pulldown transistor is activated in response to a summed current received at said first summing node, whereby said output conductor is discharged to a ground voltage supplied to said operational amplifier circuit during use.

18. The operational amplifier circuit as recited in claim 17, wherein said first summing node consists essentially of a current having a substantially linear response to voltage upon said first input conductor.

19. The operational amplifier circuit as recited in claim 18, wherein said linear response is reproduced as voltage upon said output conductor at a voltage range between voltages which power said operational amplifier circuit during use.

20. The operational amplifier circuit as recited in claim 17, wherein the mirrored current from said first conductive path transitions from a high-to-low current state at a time dissimilar from a transition of the current produced through said third conductive path.

21. The operational amplifier circuit as recited in claim 17, further comprising:

a second summing node coupled to receive mirrored current from said second conductive path as well as current produced through a fourth conductive path formed by a signal upon the gate terminal of said first input transistor.

22. The operational amplifier circuit as recited in claim 21, wherein said second summing node consists essentially of a current having a substantially linear response to voltage upon said second input conductor.

23. The operational amplifier circuit as recited in claim 22, wherein said linear response is reproduced as voltage upon said output conductor at a voltage range between voltages which power said operational amplifier circuit during use.

24. The operational amplifier circuit as recited in claim 21, wherein the mirrored current from said second conductive path transitions from a high-to-low current state at a time dissimilar from a transition of the current produced through said fourth conductive path.

25. The operational amplifier circuit as recited in claim 17, whereupon said pullup transistor is activated and said pulldown transistor is deactivated in response to a lack of said summed current received at said first summing node, whereby said output conductor is charged to a power supply voltage supplied to said operational amplifier circuit during use.

* * * * *